US008592899B2

(12) United States Patent  (10) Patent No.: US 8,592,899 B2
Jang et al.  (45) Date of Patent: Nov. 26, 2013

(54) TRANSISTOR HAVING VERTICAL CHANNEL

(75) Inventors: Se-Aug Jang, Ichon-shi (KR);
Hong-Seon Yang, Ichon-shi (KR);
Heung-Jae Cho, Ichon-shi (KR);
Min-Gyu Sung, Ichon-shi (KR);
Tae-Yoon Kim, Ichon-shi (KR);
Sook-Joo Kim, Ichon-shi (KR)

(73) Assignee: SK hynix Inc., Icheon-si (KR)

( * ) Notice: Subject to any disclaimer, the term of this patent is extended or adjusted under 35 U.S.C. 154(b) by 296 days.

(21) Appl. No.: 12/857,432

(22) Filed: Aug. 16, 2010

(65) Prior Publication Data

US 2010/0308403 A1  Dec. 9, 2010

Related U.S. Application Data

(62) Division of application No. 12/165,427, filed on Jun. 30, 2008, now Pat. No. 7,776,694.

(30) Foreign Application Priority Data

Feb. 28, 2008  (KR) .......................... 10-2008-0018439

(51) Int. Cl.
*H01L 29/66*  (2006.01)
(52) U.S. Cl.
USPC .................................. 257/334; 257/E29.262
(58) Field of Classification Search
CPC ...................... H01L 29/7813; H01L 29/42368; H01L 29/407
USPC .................................. 257/334, 751, E29.262
See application file for complete search history.

(56) References Cited

U.S. PATENT DOCUMENTS

| 2004/0036051 | A1 | 2/2004 | Sneh |
| 2004/0043550 | A1 | 3/2004 | Chakihara et al. |
| 2004/0164362 | A1* | 8/2004 | Conley et al. .................. 257/407 |
| 2004/0183142 | A1 | 9/2004 | Matsuo et al. |
| 2004/0263706 | A1 | 12/2004 | Cho et al. |
| 2005/0130414 | A1 | 6/2005 | Choi et al. |
| 2006/0097304 | A1* | 5/2006 | Yoon et al. .................... 257/307 |
| 2007/0001241 | A1 | 1/2007 | Lim et al. |
| 2007/0082448 | A1 | 4/2007 | Kim et al. |

FOREIGN PATENT DOCUMENTS

| KR | 1020060041415 A | 5/2006 |
| KR | 100618875 B1 | 8/2006 |
| KR | 1020070058906 A | 6/2007 |
| KR | 1020080011491 A | 2/2008 |

* cited by examiner

*Primary Examiner* — Nikolay Yushin
(74) *Attorney, Agent, or Firm* — Kilpatrick Townsend & Stockton LLP

(57) ABSTRACT

A semiconductor device including vertical channel transistor and a method for forming the transistor, which can significantly decrease the resistance of a word line is provided. A vertical channel transistor includes a substrate including pillars each of which has a lower portion corresponding to a channel region. A gate insulation layer is formed over the substrate including the pillars. A metal layer having a low resistance is used for forming a surrounding gate electrode to decrease resistance of a word line. A barrier metal layer is formed between a gate insulation layer and a surrounding gate electrode so that deterioration of characteristics of the insulation layer is prevented. A world line is formed connecting gate electrodes formed over the barrier layer to surround the lower portion of each pillar.

14 Claims, 14 Drawing Sheets

A-A'

A-A'

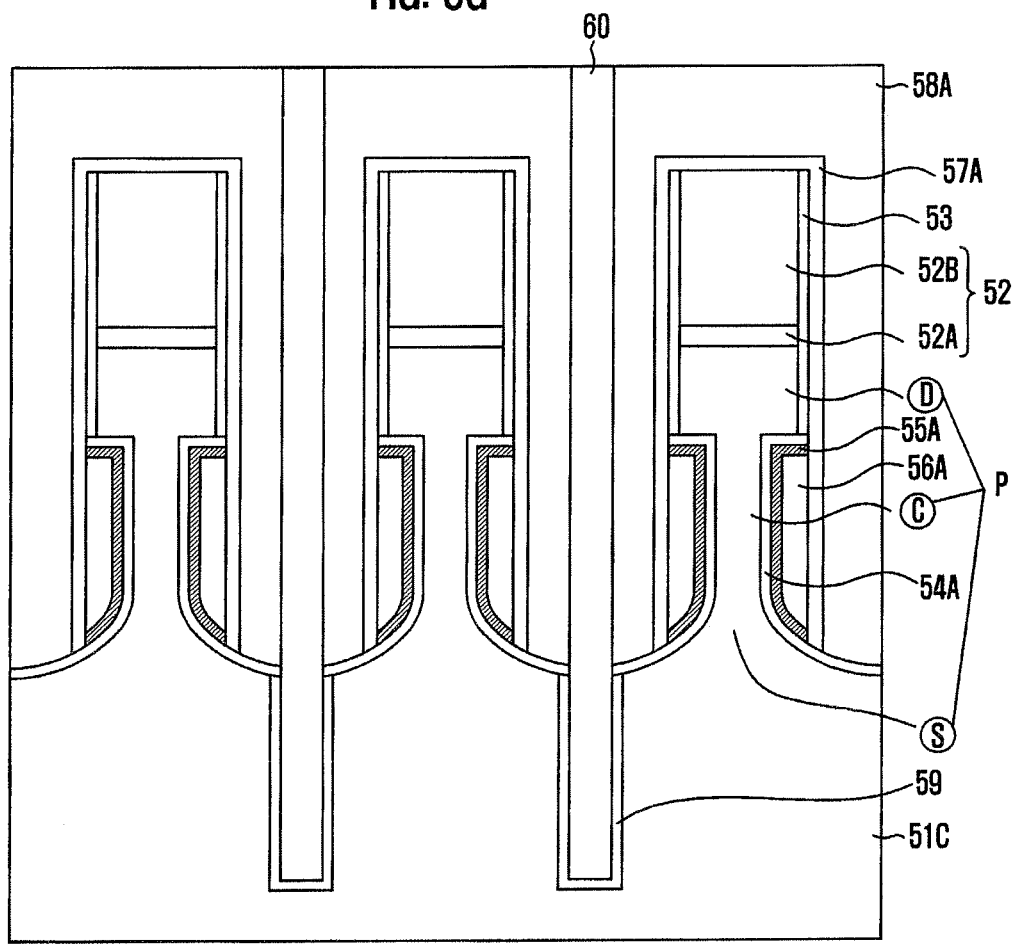

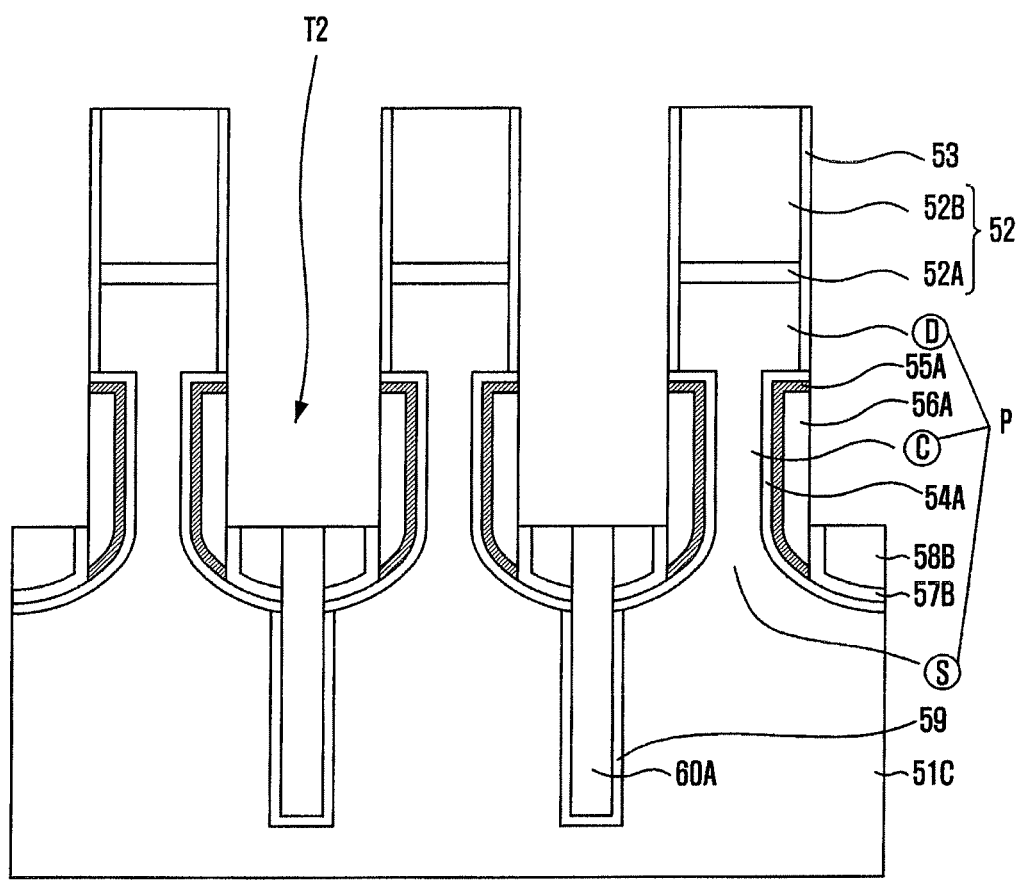

TRANSISTOR HAVING VERTICAL CHANNEL

CROSS-REFERENCE TO RELATED APPLICATION

The present invention is a divisional of U.S. patent application Ser. No. 12/165,427 filed on Jun. 30, 2008, which claims priority of Korean patent application number 10-2008-0018439 filed on Feb. 28, 2008, both of which are incorporated by reference in their entirety.

BACKGROUND OF THE INVENTION

The present invention relates to a method for fabricating a semiconductor device, and more particularly, to a transistor having a vertical channel in the semiconductor device and a method for fabricating the same.

Recently, a research on a transistor having a vertical channel is actively progressed to increase the degree of integration of semiconductor devices.

FIG. 1A illustrates a plane view of a typical transistor having a vertical channel and FIG. 1B illustrates a cross-sectional view of a cell taken along a line A-A' in FIG. 1A. The plane view in FIG. 1A is taken along plane cut out the line A-A' while maintaining a height of a dotted line in FIG. 1B.

Referring to FIGS. 1A and 1B, a plurality of semiconductor pillars P is formed over a substrate 11. A pillar P includes a substrate material and has a portion which is vertically protruding from the substrate 11. Furthermore, as shown in FIG. 1A, the pillars P are arranged in a first direction and a second direction crossing the first direction. The pillar P has an upper part, a middle part and a lower part. In other words, the pillar P has a drain region D, a channel region C, and a source region S. The channel region C connects the drain region D and the source region S.

An electrode 13 is formed surrounding outside of the middle part of the pillar P, the channel region C. An insulation layer 12 is formed between the surrounding electrode 13 and the pillar P. A damascene word line 14 is formed extending along the first direction while electrically connecting neighboring surrounding electrodes on sidewalls of the surrounding electrode 13. The reference numerals 15 and 16 represent a first inter-layer insulation layer and a second inter-layer insulation layer, respectively.

In a semiconductor device including the transistor that has the above mentioned vertical channel structures, a word line is formed with the surrounding electrodes 13 and the damascene word line 14. In such semiconductor device, a width of the damascene word line 14 is limited by the surrounding electrodes 13. Thus, resistance of the word line is determined by the surrounding electrodes 13.

Since the surrounding electrodes 13 and the damascene word line 14 are generally formed of polysilicon, the resistance of the word line is highly increased.

SUMMARY OF THE INVENTION

Embodiments of the present invention are directed to provide a vertical channel transistor and a method for forming the transistor, which can significantly decrease resistance of a word line by forming a barrier metal layer between a gate insulation layer and a surrounding electrode while using a metal layer having a low resistance as the surrounding gate electrode. The barrier metal layer prevents deterioration of characteristics of the insulation layer.

In accordance with an aspect of the present invention, there is provided a semiconductor device including vertical channel transistors. The semiconductor device includes a substrate including pillars each of which has a lower portion horizontally recessed to a certain width, wherein the lower portion corresponds to a channel region of the vertical channel. The semiconductor device further includes an insulation layer formed over the substrate including the pillars and a barrier layer formed over a portion of the insulation layer corresponding to the lower portion of each pillar. A gate electrode is formed over the barrier layer, surrounding the lower portion of each pillar and a word line is formed connecting the gate electrodes surrounding the pillars.

In accordance with another aspect of the present invention, there is provided a method for fabricating a semiconductor device including vertical channel transistors. The method includes providing a substrate including pillars each of which has a lower portion recessed to a certain width, wherein the lower part corresponds to a channel region of a vertical channel transistor. The method includes forming a gate insulation layer over a surface of the substrate including the pillars, thereby forming a first resultant structure, and forming a barrier layer over a portion of the insulation layer corresponding to the lower portion of each pillar. A gate electrode is formed over the barrier layer, surrounding the lower portion of each pillar, thereby forming a second resultant structure, and forming a word line to connect the gate electrodes formed over the pillars.

BRIEF DESCRIPTION OF THE DRAWINGS

FIGS. 5A to 5J illustrate cross-sectional views of a method for fabricating a transistor having a vertical channel in a semiconductor device in accordance with an embodiment of the present invention.

DESCRIPTION OF SPECIFIC EMBODIMENTS

Hereinafter, a semiconductor device with a vertical channel transistor and a method for fabricating the same in accordance with the present invention will be described in detail with reference to the accompanying drawings.

Figure 1A:
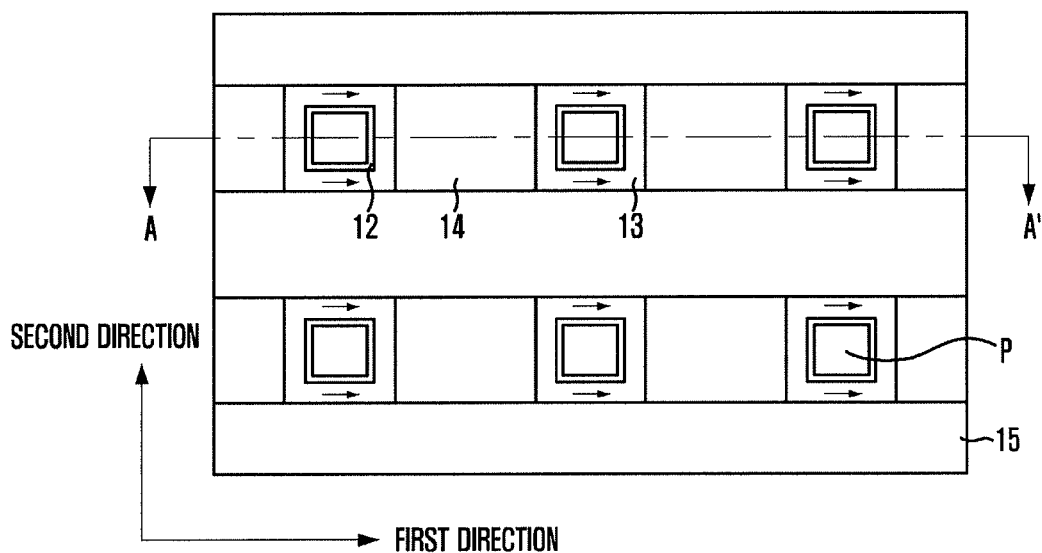
FIG. 1A illustrates a plane view of a typical transistor having a vertical channel.
Figure 1B:
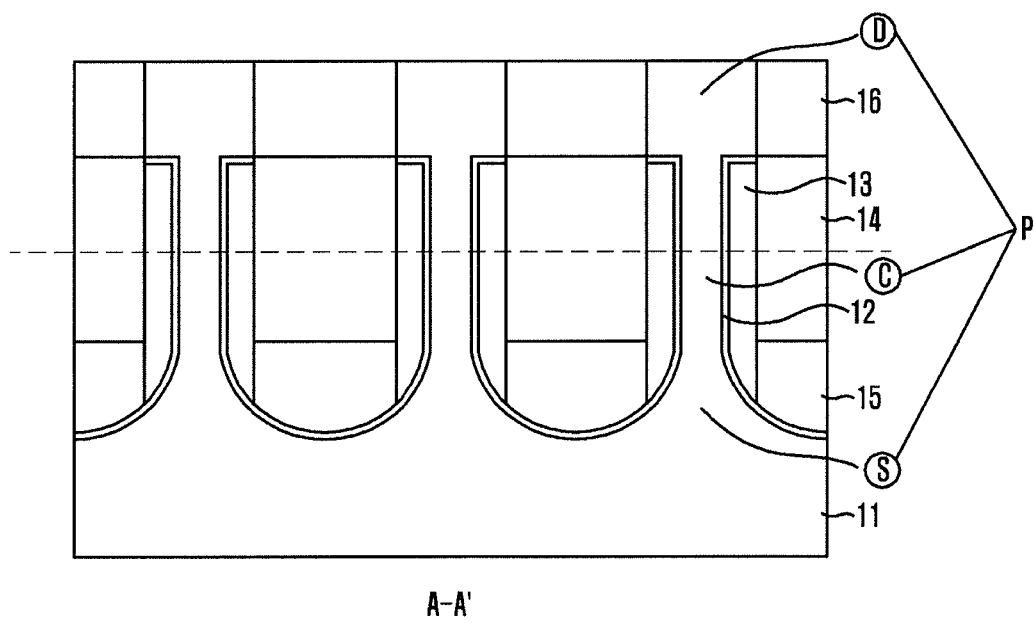
FIG. 1B illustrates a cross-sectional view of a cell taken along the line A-A' in FIG. 1A.
Figure 2A:
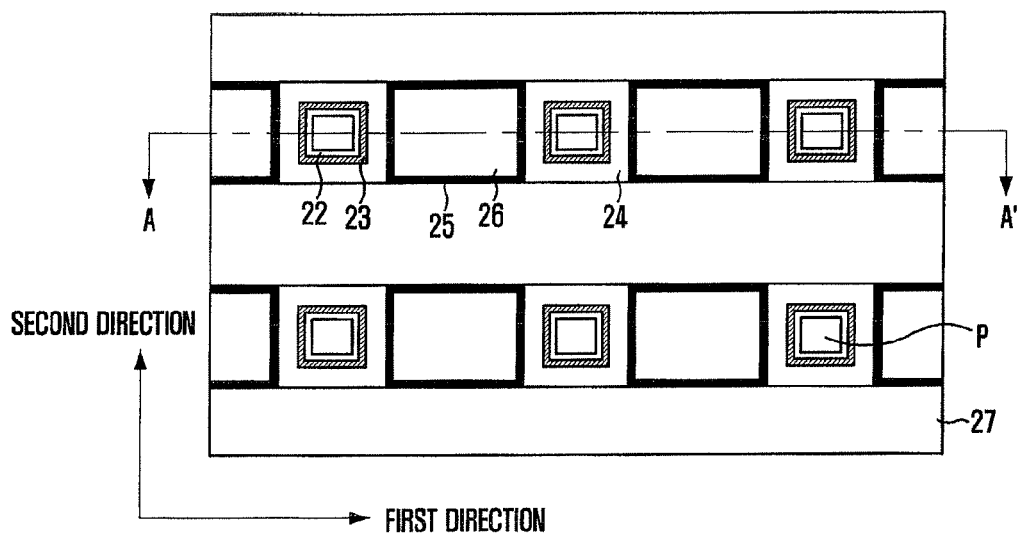
FIG. 2A illustrates a plane view of a transistor having a vertical channel in a semiconductor device in accordance with an embodiment of the present invention.
Figure 2B:
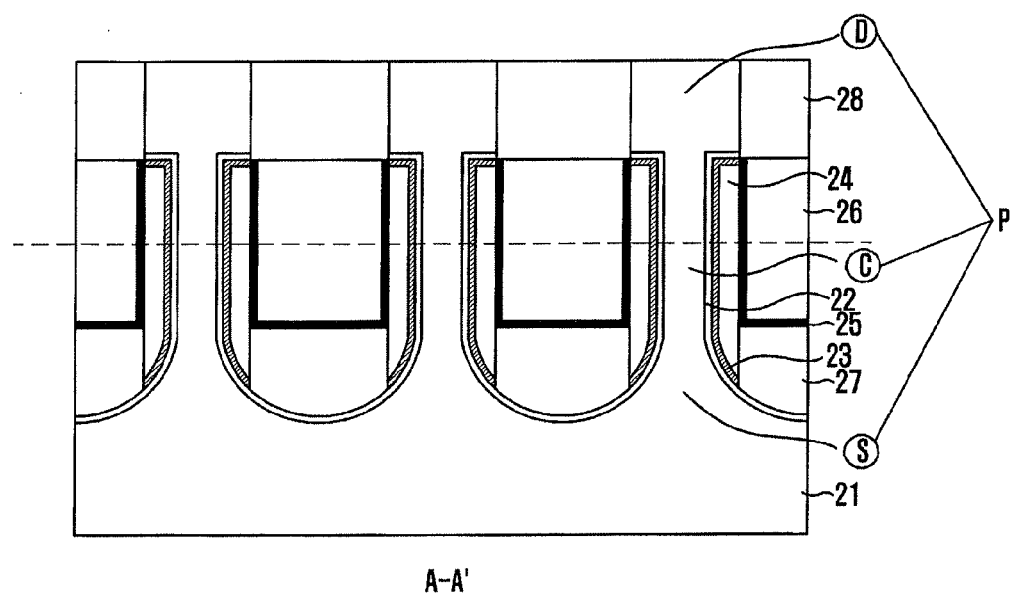
FIG. 2B illustrates a cross-sectional view of a cell taken along the line A-A' in FIG. 2A.

FIG. 2A illustrates a plane view of a transistor having a vertical channel in a semiconductor device in accordance with an embodiment of the present invention and FIG. 2B illustrates a cross-sectional view of a cell taken along the line A-A' in FIG. 2A. The plane view in FIG. 2A is taken by cutting the semiconductor device along a dotted line in FIG. 2B.

Referring to FIGS. 2A to 2B, a plurality of semiconductor pillars (hereinafter, pillars) P is formed over a substrate 21.

The pillar P includes a substrate material and has a portion which is vertically protruding from the substrate 21. As shown in FIG. 2A, the pillars P are arranged in a first direction and a second direction crossing the first direction. A pillar P has an upper part, a middle part and a lower part. In other words, the pillar P has a drain region D, a channel region C, and a source region S. The channel region C connects the drain region D and the source region S.

In one embodiment, an electrode 24 is formed surrounding the outside of the middle part of the pillar P, the channel region C, and a first insulation layer 22 is formed between the electrode 24 and the pillar P, wherein the electrode 24 is a surrounding electrode for a gate. The surrounding gate electrode 24 is desirably formed of a metal layer having a low resistance. The metal layer includes one selected from a group consisting of titanium nitride (TiN), aluminum (Al), copper (Cu) and a combination thereof.

The metal layer for forming the surrounding gate electrode 24 is formed by a method of forming a layer having a good step-coverage characteristic because of the nature of a structure of the transistor having the vertical channel. Such a method may be a sequential flow deposition (SFD) method or an atomic layer deposition (ALD) method. When the pillar P is vertically protruding from the substrate 21, a sidewall of the pillar P is recessed to a given depth. The surrounding gate electrode 24 is formed to fill the recessed portion of the pillar P. A depth of the surrounding gate electrode 24 is variable in accordance with a width of the pillar P.

However, the performance of the first insulation layer 22 can be deteriorated while forming the metal layer with the SFD method or the ALD method. A barrier metal layer 23 is formed between the first insulation layer 22 and the surrounding gate electrode 24 in order to prevent the above mentioned limitation. The barrier metal layer 23 includes one selected from a group consisting of tantalum nitride (TaN), tantalum carbide nitride (TaCN) and a combination thereof. More details will be described with reference to FIGS. 4A and 4B.

In one embodiment, a damascene word line 26 is formed extending along the first direction while electrically connecting adjacent surrounding gate electrodes 24. The damascene word line 26 connects on one side of the surrounding gate electrodes 24. The damascene word line 26 includes a metal layer having a low resistance. It is desirable to form the damascene word line 26 with a tungsten (W) layer which can be thickly formed without a crack. An inter-layer insulation layer 27 is formed over sidewalls of the damascene word line 26 and under the damascene word line 26. However, since the W layer has a bad adhesive property to the inter-layer insulation layer 27, an adhesive layer 25 is formed over the sidewalls of the damascene word line 26 and under the damascene word line 26. In one embodiment, the adhesive layer 25 includes a TiN layer. The reference numerals 28 represents an inter-layer insulation layer formed after forming the damascene word line 26.

Figure 3:
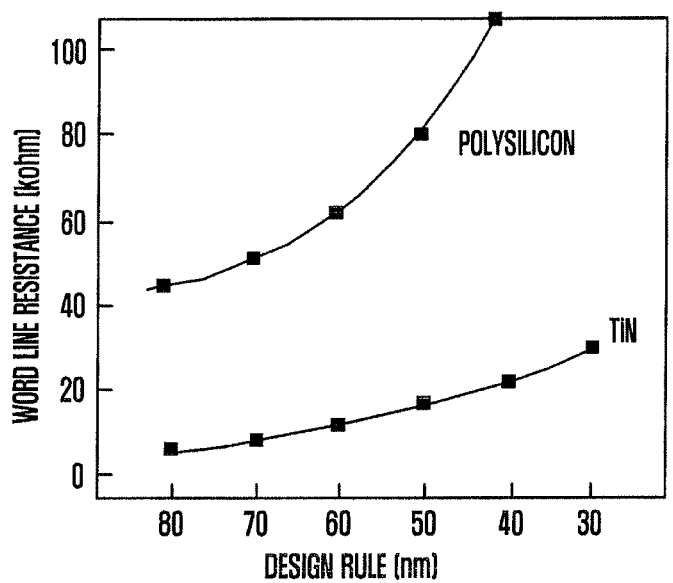
FIG. 3 illustrates a graph comparing word line resistance changes in a typical word line and a word line in accordance with the present invention according to different design rules.

FIG. 3 illustrates a graph comparing word line resistance changes in a typical word line and a word line in accordance with an embodiment of the present invention.

In FIG. 3, TiN is used as an example of metal for the surrounding gate electrode of the word line in an embodiment of the present invention. Polysilicon is used for the surrounding gate electrode of the word line in a conventional vertical channel transistor.

As shown, when TiN is applied to the surrounding gate electrode in accordance with an embodiment of the present invention, word line resistance is significantly lower than when polysilicon is applied to the surrounding gate electrode according to the typical method. For example, the word line having a TiN layer has world line resistance that is approximately one-fifth to approximately one-tenth of the word line resistance in the typical word line.

Furthermore, a difference between the resistance of the typical word line and the resistance of the word line in accordance with an embodiment of the present invention is getting much bigger as the design rules are decreased. Thus, when the TiN layer is used as the surrounding gate electrode, it has many advantages.

However, when a metal layer such as a TiN layer is used as a surrounding gate electrode, characteristics of the insulation layer still can be deteriorated because a SFD method or an ALD method is applied to form the metal layer in order to ensure step coverage characteristics. Thus, a barrier metal layer such as a TaN layer is formed between the metal layer and an insulation layer in embodiments of the present invention.

Figure 4A:
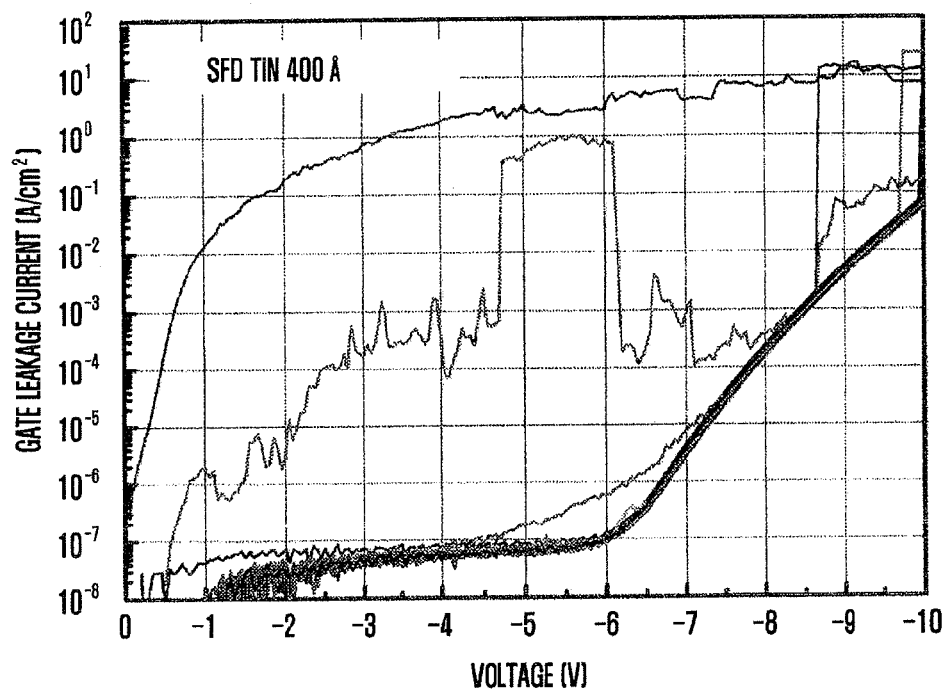
FIGS. 4A and 4B illustrate graphs comparing current-voltage (I-V) characteristics of an insulation layer according to existence and nonexistence of tantalum nitride (TaN) layer as a barrier metal layer.
Figure 4B:
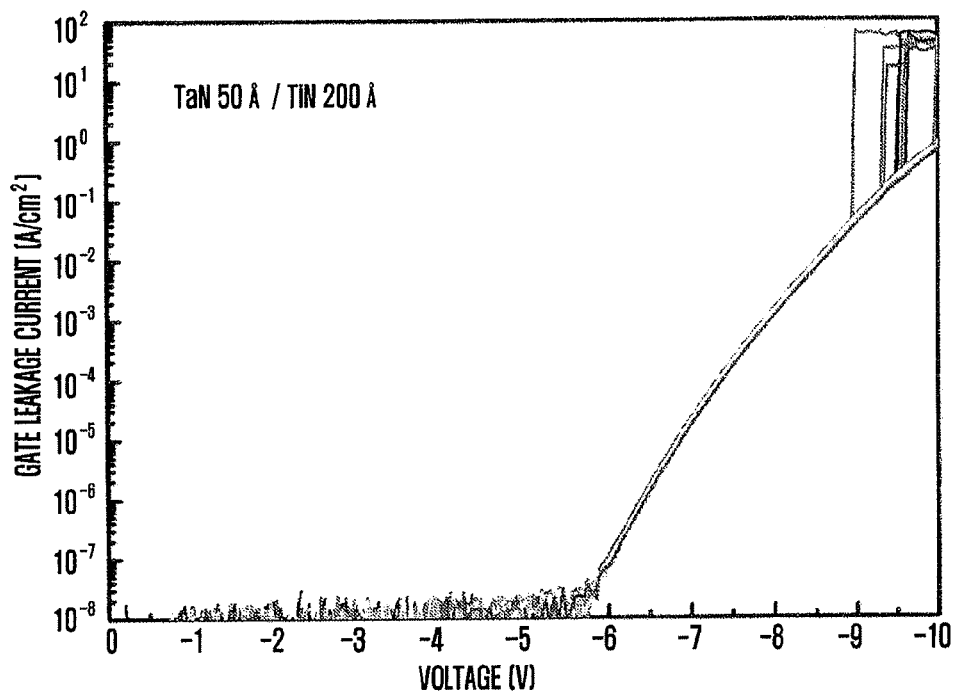

FIGS. 4A and 4B illustrate graphs comparing current-voltage (I-V) characteristics of an insulation layer according to existence and nonexistence of a barrier metal layer. The graphs are obtained by several experiments. Specifically, a TaN layer is used as the barrier metal layer in FIGS. 4A and 4B.

Referring to FIG. 4A, it is shown that a leakage current is sharply increased when a TiN layer as a surrounding gate electrode is directly formed on an insulation layer (without a barrier layer). The reason of sharp increasing of the leakage current is due to diffusion of impurities into the insulation layer. When the TiN layer is formed with a SFD method or an ALD method in order to ensure step coverage characteristics of the TiN layer Chlorine (Cl) impurities are generated from tetrachlorotitanium ($TiCl_4$) used for depositing the TiN layer. As a result, the Cl impurities can be contained in the TiN layer. The Cl impurities contained in the TiN layer can reach the insulation layer and it has an effect on the insulation layer. The above described phenomenon can be caused as well even if another metal layer is deposited in lieu of the TiN layer.

However, referring to FIG. 4B, when a TaN layer is formed as a barrier metal layer between the insulation layer and the TiN layer, it is shown that a leakage current is much lower than when a TiN layer (used as a surrounding gate electrode) is directly formed on the insulation layer. Herein, the thickness of the TaN layer is approximately 50 Å and the thickness of the TiN layer is approximately 200 Å.

That is, referring to FIGS. 4A and 4B, when the TaN layer is formed as the barrier metal layer, the gate leakage current can maintain approximately $10^{-8}$ A/$cm^2$ while voltage applied is up to approximately −5.5 V. On the other hand, when the TiN layer is formed as the barrier metal layer, the gate leakage current is upper than $10^{-8}$ A/$cm^2$.

In this manner, the leakage current can be substantially reduced since the Cl impurities contained in the TiN layer cannot reach the insulation layer due to the barrier metal layer.

In one embodiment, the metal layer having a low resistance is used to form the surrounding gate electrode, and the barrier metal layer is formed between the surrounding gate electrode and the insulation layer to prevent diffusion of impurities into the insulation layer. In such an embodiment, the metal layer is formed by the SFD method or the ALD method to acquire good step coverage characteristics while the deterioration of characteristics of the insulation layer can be prevented. Herein, the metal layer includes a TiN layer and the barrier metal layer includes a TaN layer.

FIGS. 5A to 5J illustrate cross-sectional views of a method for fabricating a transistor having a vertical channel in a semiconductor device in accordance with an embodiment of the present invention. The cross-sectional views in FIGS. 5A to 5J are taken along the line A-A' in FIG. 2A.

Figure 5A:
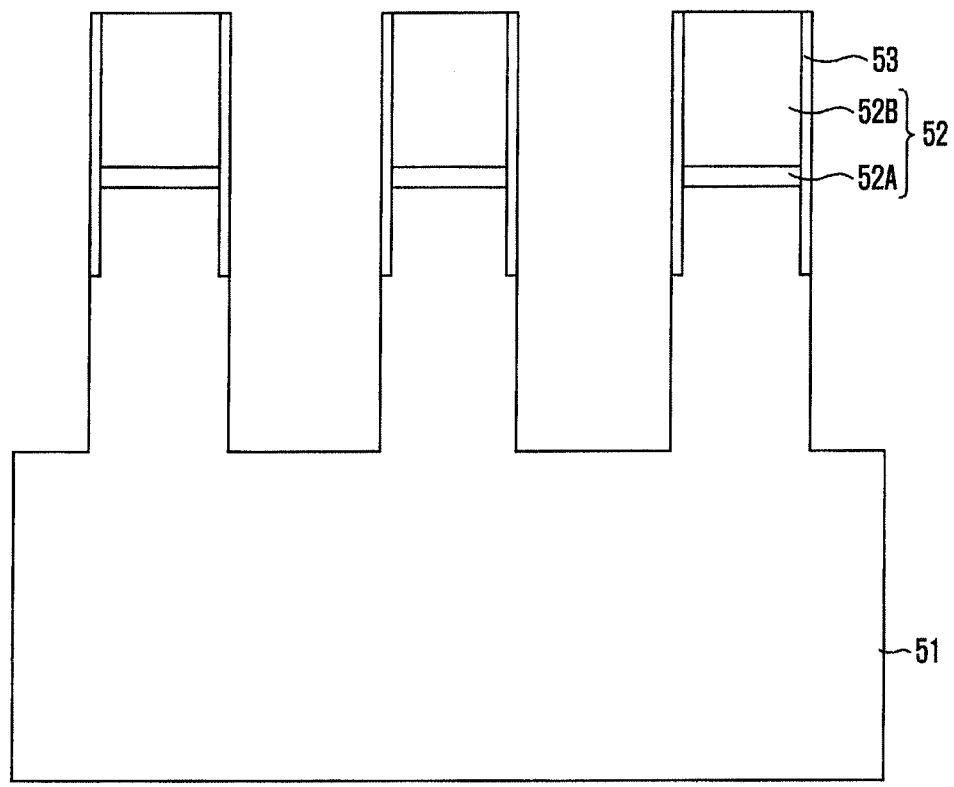

Referring to FIG. 5A, a hard mask pattern 52 is formed over a substrate 51 to form a semiconductor pillar. A plurality of hard mask patterns is arranged along the first direction and the second direction as shown in FIG. 2A. The hard mask pattern 52 may have a stack structure of an oxide layer 52A and a nitride layer 52B. The substrate 51 is etched to a first depth using the hard mask pattern 52 as an etch barrier, thereby forming an upper part of the semiconductor pillar. Then, spacers 53 are formed on sidewalls of the hard mask pattern 52 and the upper part of the semiconductor pillar. A first exposed portion of the substrate 51 after forming the spacers is further etched to a second depth using the hard mask pattern 52 and the spacers 53 as an etch barrier, thereby forming a lower part of the semiconductor pillar.

Figure 5B:
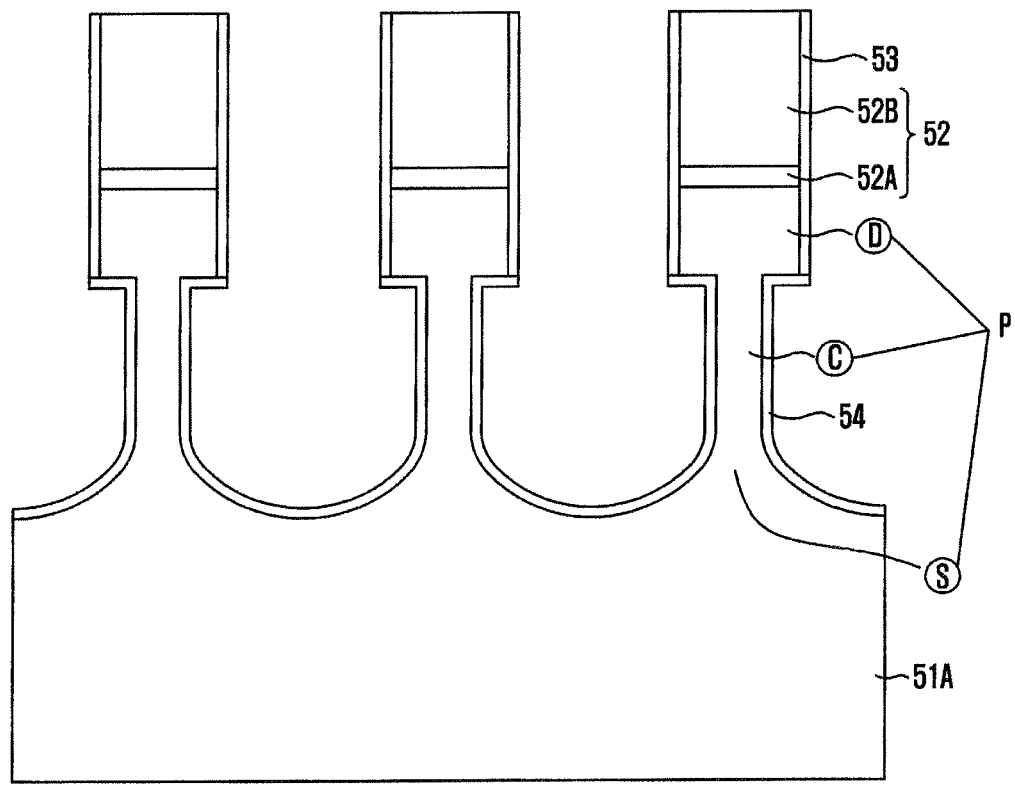

Referring to FIG. 5B, a second exposed portion of the substrate 51 after forming the lower part of the semiconductor pillar is isotropically etched using the hard mask pattern 52 and the spacers 53 as an etch barrier so that the lower part of the semiconductor pillar is recessed. In another embodiment of the present invention, the lower port of the semiconductor pillar may not be recessed. As a result, the semiconductor pillar P having an active region is formed to include an upper part, a middle part and a lower part. The upper part and the lower part are source/drain regions S/D and the middle part is a channel region C connecting the drain region D and the source region S. In FIGS. 5B to 5J, although the upper part and the lower part are represented as the drain region D and the source region S, respectively, the upper part and the lower part could be the source region S and the drain region D, respectively.

In FIG. 5B, a reference numeral 51A represents a first etched substrate 51A formed after performing the isotropic etching on the substrate 51. A first insulation layer 54 is formed over a portion of the first etched substrate 51A not covered by the hard mask pattern 52 and the spacers 53, thereby forming a first resultant structure.

Figure 5C:
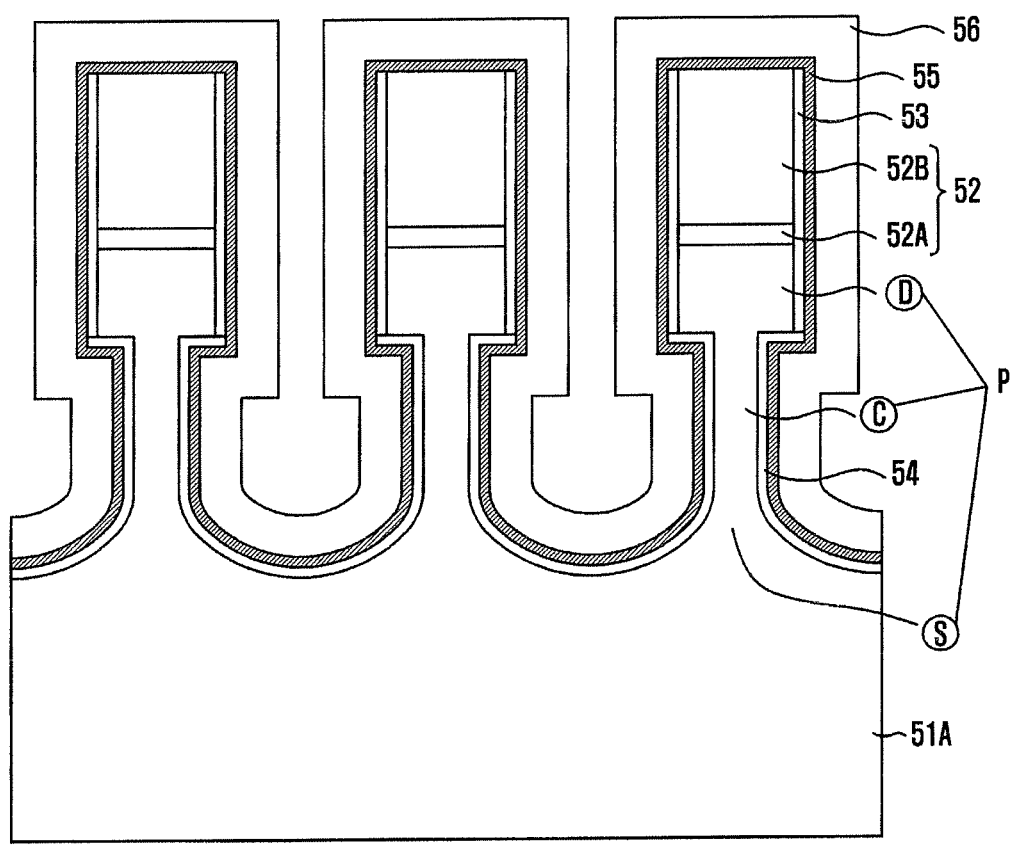

Referring to FIG. 5C, a barrier metal layer 55 is formed over the first resultant structure. In one embodiment, the barrier metal layer 55 includes one selected from a group consisting of TaN, tantalum carbide nitride (TaCN) and a combination thereof. The barrier metal layer 55 has a thickness ranging from approximately 30 Å to approximately 100 Å.

A metal layer 56 for a surrounding gate electrode is formed over the barrier metal layer 55. The metal layer 56 includes one selected from a group consisting of TiN, aluminum (Al), copper (Cu) and a combination thereof. As described above, in some embodiments, the metal layer 56 is formed by a SFD method or an ALD method in order to ensure step coverage characteristics. A thickness of the metal layer 56 is approximately 50 Å to approximately 300 Å.

Figure 5D:
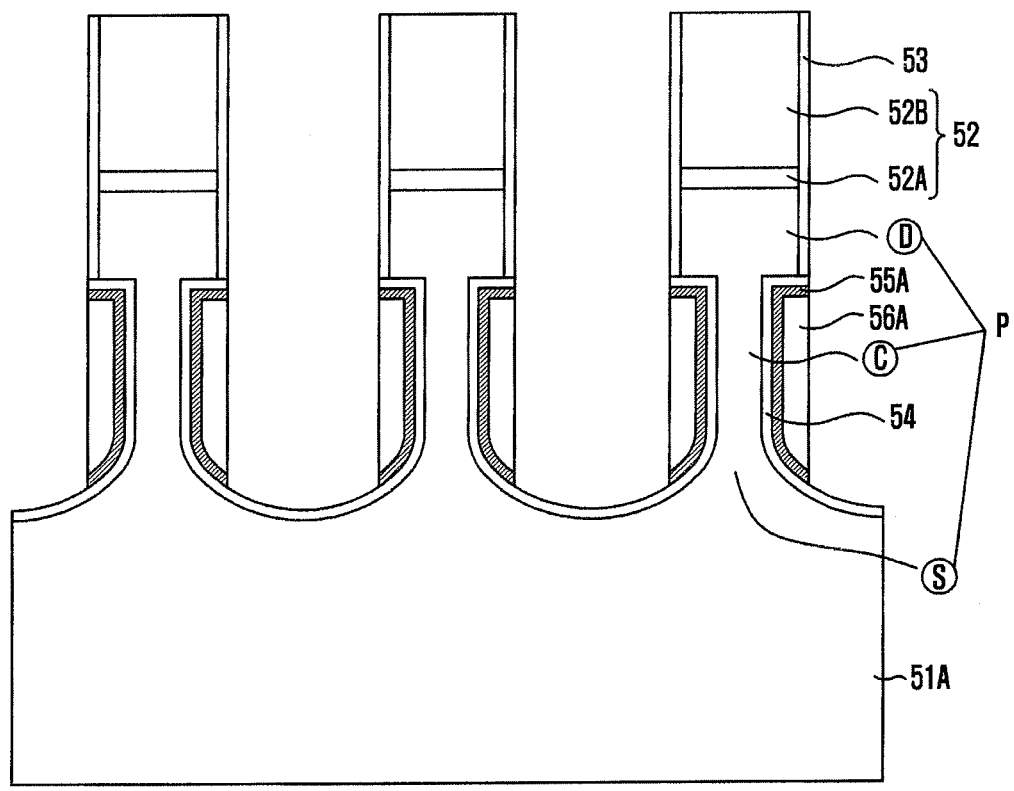

Referring to FIG. 5D, a dry etching process is performed on the metal layer 56 using the hard mask patterns 52 and the spacers 53 as an etch barrier until the first insulation layer 54 on the first etched substrate 51A is exposed. As a result, an etched metal layer 56A for the surrounding gate electrode and an etched barrier metal layer 55A are formed under the drain region D, surrounding the channel region C. Hereinafter, the etched metal layer 56A surrounding the channel region C is referred to as a metal surrounding gate electrode.

Figure 5E:
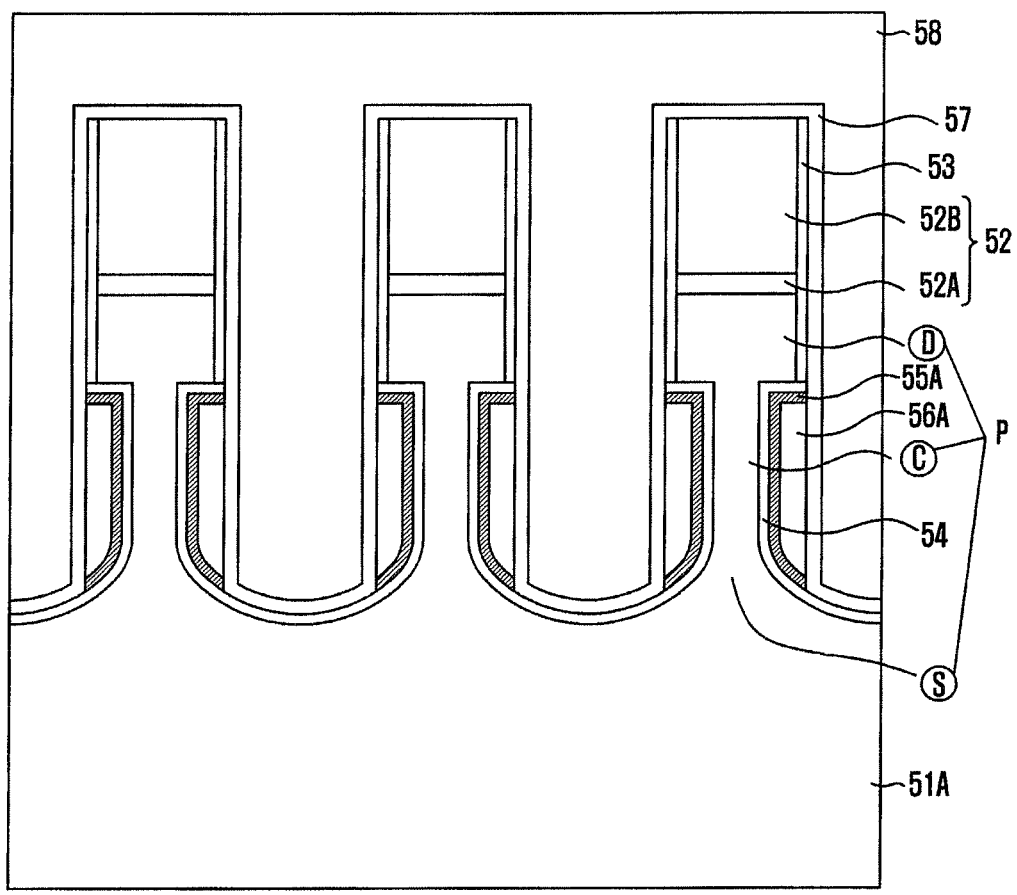

Referring to FIG. 5E, a capping layer 57 is formed over a second resultant including the metal surrounding gate electrode 56A in order to protect the metal surrounding gate electrode 56A. The capping layer 57 includes a nitride layer and a thickness ranging from approximately 50 Å to approximately 70 Å. A first inter-layer insulation layer 58 is formed over the capping layer 57. In one embodiment, the first inter-layer insulation layer 58 includes an oxide layer.

Figure 5F:
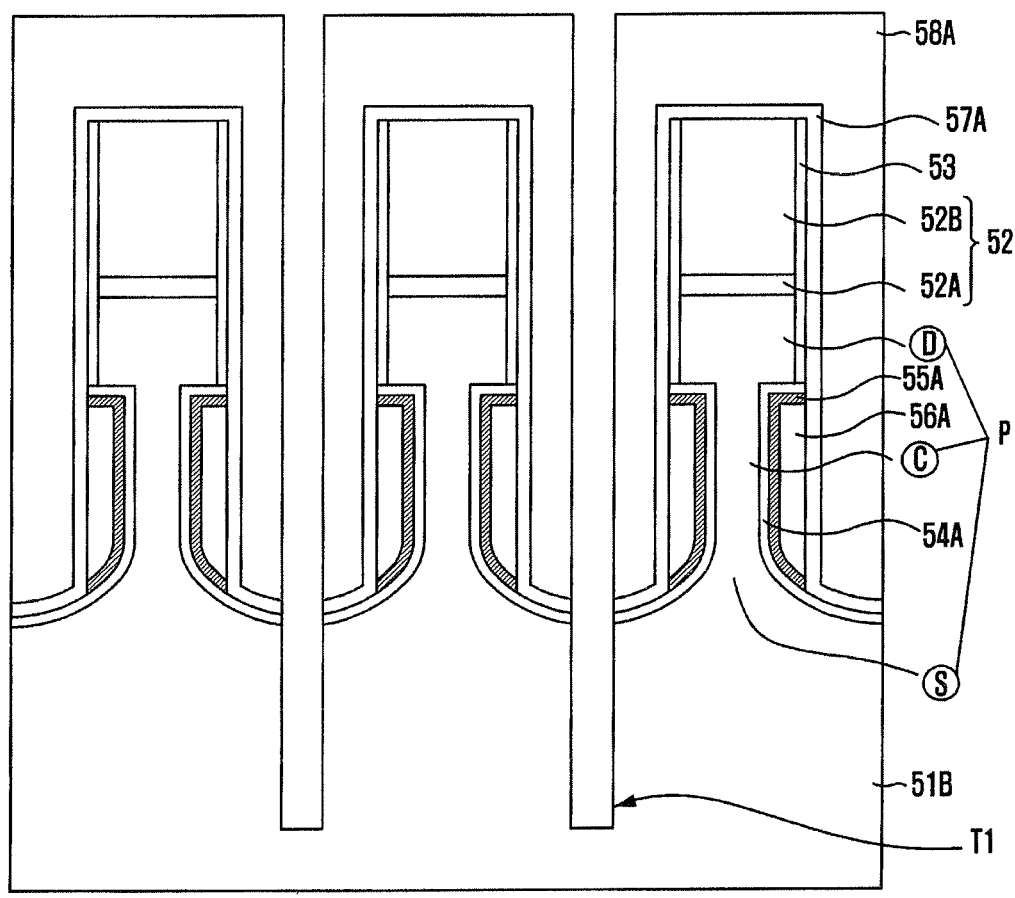

Referring to FIG. 5F, a photoresist pattern (not shown) is formed over the first inter-layer insulation layer 58 so as to form a trench for device isolation. The first inter-layer insulation layer 58, the capping layer 57 and the first etched substrate 51A are etched to a given depth using the photoresist pattern as an etch mask. Thus, trenches for device isolation T1 are formed between the pillars P arranged along the second direction and the trenches T1 are formed extending in the second direction. Herein, the depth of the trench T1 ranges from approximately 1,000 Å to approximately 2,000 Å. Reference numerals 51B, 54A, 57A and 58A represent a second etched substrate, an etched insulation layer, a first etched capping layer and a first etched first inter-layer insulation layer, respectively, formed after the trench T1 is formed.

Referring to FIG. 5G, a surface of an exposed portion of the second etched substrate 51B by the trench T1 is oxidized, thus an oxide layer 59 is formed. The thickness of the oxide layer 59 ranges from approximately 20 Å to approximately 50 Å. A second inter-layer insulation layer 60 is formed to fill the trench T1. A reference numeral 51C represents a partially oxidized substrate by performing an oxidation process on the exposed portion of the second etched substrate 51B.

Referring to FIG. 5H, a photoresist pattern (not shown) is formed over the first etched first inter-layer insulation layer 58A so as to form a trench for a word line. The first etched first inter-layer insulation layer 58A, the second inter-layer insulation layer 60 and the first etched capping layer 57A are removed up to a level lower than a top surface of the metal surrounding gate electrode 56A. Thus, a trench for word line T2 is formed exposing a portion of one side of the metal surrounding gate electrode 56A and extending in the first direction. Reference numerals 57B, 58B and 60A represent a second etched capping layer, a second etched first inter-layer insulation layer and a first etched second inter-layer insulation layer, respectively, formed after performing an etch process on the first etched capping layer 57A, the first etched first inter-layer insulation layer 58A and the second inter-layer insulation layer 60.

Figure 5I:
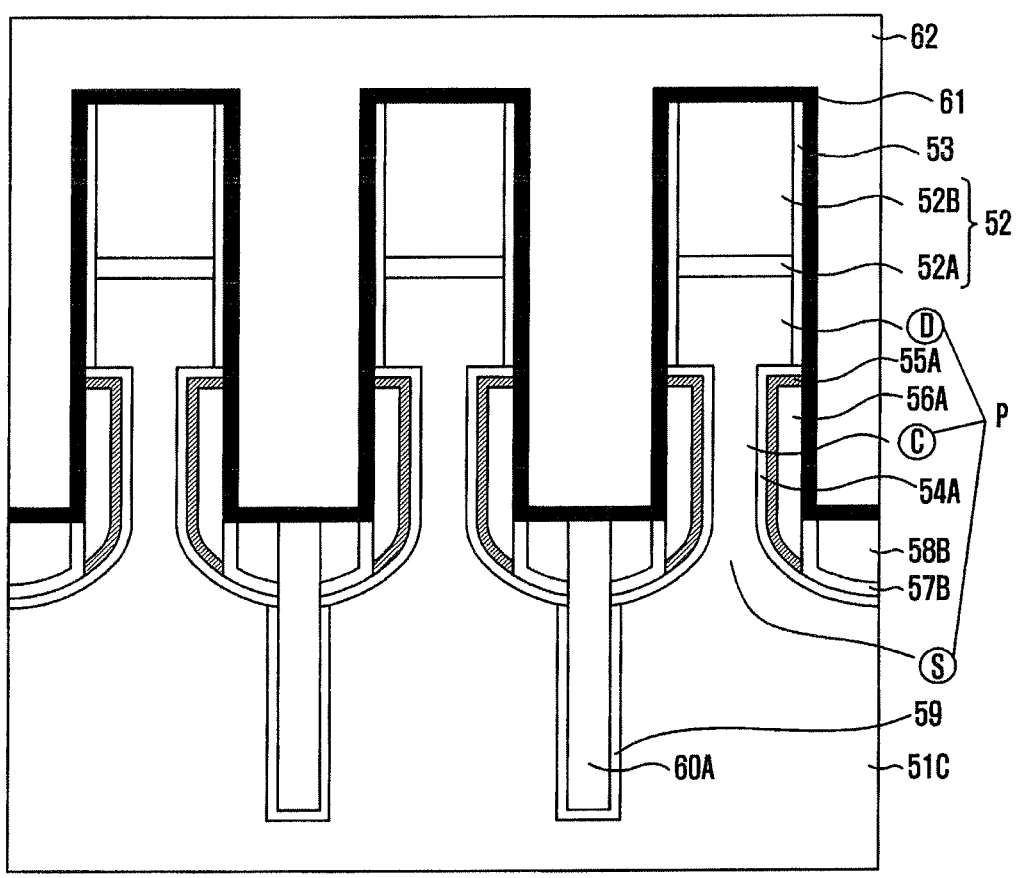

Referring to FIG. 5I, an adhesive layer 61 is formed over a third resultant structure including the trench T2 in order to increase adhesion to a subsequent word line and insulation layers such as the second etched first inter-layer insulation layer 58B and the first etched second inter-layer insulation layer 60A. As mentioned above, it is desirable to form the adhesive layer 61 with a TiN layer.

A conductive layer 62 is formed over a fourth resultant structure including the adhesive layer 61. The conductive layer 62 is formed with the thickness as much as sufficiently covering and filling the trench T2. It is more desirable to form the conductive layer 62 with a W layer.

Figure 5J:
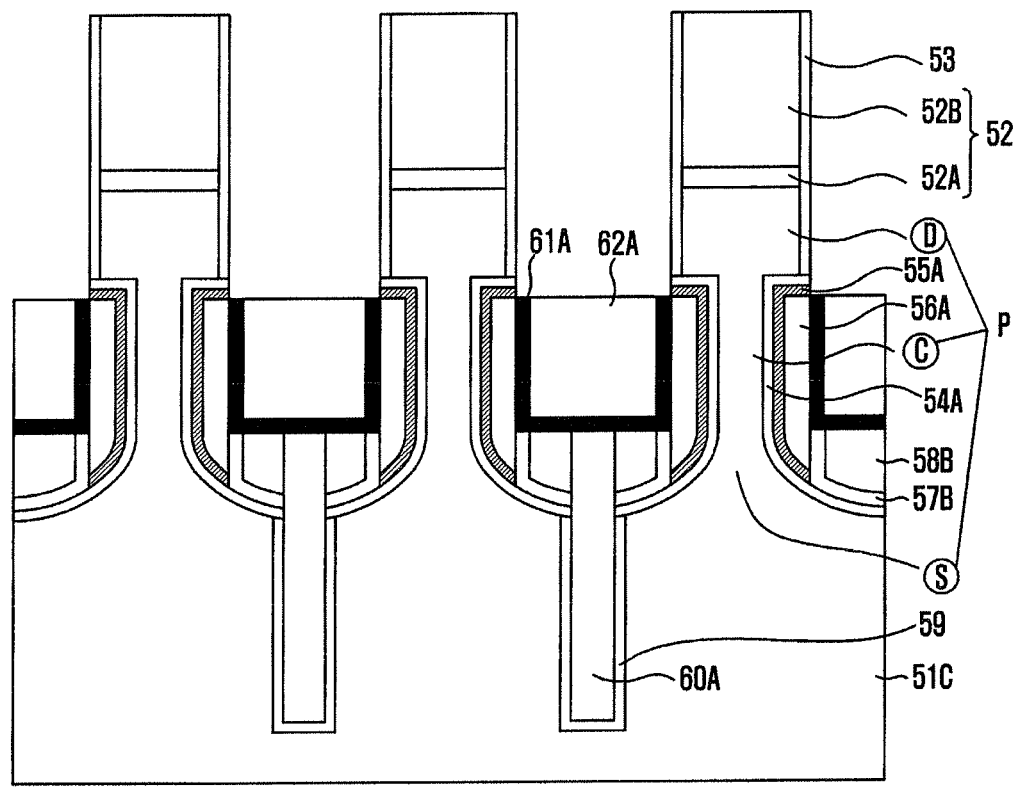

Referring to FIG. 5J, the conductive layer 62 and the adhesive layer 61 are etched to a level corresponding to the top of the metal surrounding gate electrode 56A. Thus, a damascene word line 62A is formed to extend in the first direction and electrically connect the metal surrounding gate electrodes 56A. A reference numeral 61A represents an etched adhesive layer formed by performing the etch process on the adhesive layer.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A semiconductor device including vertical channel transistors, comprising:
    a substrate including a plurality of pillars each of which has a lower portion, wherein the lower portion corresponds to a channel region of a vertical channel transistor;
    an insulation layer formed over the substrate including the plurality of pillars;
    a barrier layer formed over a portion of the insulation layer corresponding to the lower portion of each pillar;
    a gate electrode formed over the barrier layer to surround the lower portion of each pillar;
    a first trench extending into the substrate between adjacent ones of the plurality of pillars;
    an inter-layer insulation layer filling the first trench; and
    a second trench formed over the inter-layer insulation layer, the second trench including a word line coupled to the gate electrodes surrounding the plurality of pillars.

2. The device as recited in claim 1, wherein the lower portion has a recessed type, wherein a width of the lower portion is less than that of an upper portion of the pillars.

3. The device as recited in claim 1, wherein the gate electrode comprises a metal electrode.

4. The device as recited in claim 1, wherein the barrier layer comprises TaN and the gate electrode comprises TiN.

5. The device as recited in claim 1, further comprising an adhesive layer formed on sidewalls of the word line and under the word line.

6. The device as recited in claim 1, wherein the barrier layer has a thickness ranging from approximately 30 Å to approximately 100 Å.

7. The device as recited in claim 1, wherein the word line comprises metal.

8. The device as recited in claim 7, wherein the adhesive layer comprises a TiN layer.

9. The device as recited in claim 1, wherein the barrier layer includes a metal-nitride layer containing of tantalum (Ta) and nitride (N).

10. The device as recited in claim 9, wherein the metal-nitride layer comprises one selected from a group consisting of tantalum nitride (TaN), tantalum carbide nitride (TaCN) and a combination thereof.

11. The device as recited in claim 9, wherein the metal electrode comprises one selected from a group consisting of titanium nitride (TiN), aluminium (Al), copper (Cu) and a combination thereof.

12. The device as recited in claim 11, wherein the word line comprises a tungsten (W) layer.

13. A semiconductor device including vertical channel transistors, comprising:
    a plurality of pillars formed over a substrate, each pillar having a lower portion corresponding to a channel region of a vertical channel transistor;
    a gate insulation layer formed over the substrate including the plurality of pillars;
    a barrier layer formed over a portion of the insulation layer corresponding to the lower portion of each pillar, wherein the barrier layer includes a metal-nitride layer containing tantalum (Ta) and nitride (N);
    a metal gate electrode formed by selectively etching a metal layer formed over the barrier layer, the metal gate electrode surrounding the lower portion of each pillar;
    a first trench extending into the substrate between adjacent ones of the plurality of pillars;
    an inter-layer insulation layer filling the first trench; and
    a second trench formed over the inter-layer insulation layer, the second trench including a word line coupled to the metal gate electrodes.

14. The device as recited in claim 13, wherein the metal-nitride layer comprises one selected from a group consisting of tantalum nitride (TaN), tantalum carbide nitride (TaCN) and a combination thereof.

* * * * *